United States Patent
Liebmann et al.

[11] Patent Number: 6,055,367
[45] Date of Patent: *Apr. 25, 2000

[54] SEMICONDUCTOR DEVICE COMPENSATION SYSTEM AND METHOD

[75] Inventors: Lars Wolfgang Liebmann, Poughquag; Robert T. Sayah, Poughkeepsie, both of N.Y.

[73] Assignee: International Business Machines Corporation, Armonk, N.Y.

[ * ] Notice: This patent is subject to a terminal disclaimer.

[21] Appl. No.: 09/250,909

[22] Filed: Feb. 16, 1999

Related U.S. Application Data

[63] Continuation of application No. 08/781,401, Jan. 10, 1997, Pat. No. 5,877,964.

[51] Int. Cl.[7] .................................................. G06F 17/50
[52] U.S. Cl. ............................................................. 395/500.2
[58] Field of Search ............................................. 395/500.2

[56] References Cited

U.S. PATENT DOCUMENTS

| | | | |
|---|---|---|---|
| 4,783,749 | 11/1988 | Duzy et al. | 364/491 |
| 5,159,201 | 10/1992 | Frei | 250/492.2 |
| 5,289,040 | 2/1994 | Rogers | 257/666 |
| 5,369,596 | 11/1994 | Tokumauru | 364/491 |
| 5,420,800 | 5/1995 | Fukui | 364/491 |
| 5,477,466 | 12/1995 | Tripathi et al. | 364/489 |

*Primary Examiner*—Kevin J. Teska
*Assistant Examiner*—Hugh Jones
*Attorney, Agent, or Firm*—Schmeiser, Olsen & Watts; Daniel H. Schnurmann

[57] ABSTRACT

A method is provided that automatically generates compensated semiconductor devices based on existing VLSI CAD database circuit designs. The preferred method forms a plurality of edge projection shapes which are intersected with active area shapes to form gate edge shapes. The gate edge shapes and residual of the edge shapes are the sorted according to their relative position. These shapes are then selectively biased according to their relative position, and then are used to compensate the existing gate conductor shapes. Thus, this method provides a way to generate gate structures with compensated gate lengths for n-channel and p-channel devices based on existing gate, diffusion and implant designs. This system has the advantage of generating designs with detailed attention to the placement and minimization of jogs that negatively impact the lithography performance.

18 Claims, 10 Drawing Sheets

SEMICONDUCTOR DEVICE COMPENSATION SYSTEM AND METHOD

This application is a continuation application of U.S. application Ser. No. 08/781,401, now U.S. Pat. No. 5,877,964, entitled "Semiconductor Device Compensation System and Method", filed on Jan. 10, 1997, which is hereby incorporated by reference.

BACKGROUND OF THE INVENTION

1. Technical Field

The present invention generally relates to the manufacture of very large scale integrated (VLSI) circuits and, more specifically to computer aided design (CAD) tools used in the generation of circuit patterns.

2. Background Art

A very large scale integrated (VLSI) circuit is typically manufactured on a silicon wafer by a sequence of material additions (i.e., low pressure chemical vapor depositions, sputtering operations, etc.), material removals (i.e., wet etches, reactive ion etches etc.), and material modifications (i.e., oxidations, ion implants, etc.). The location of these material additions, removals, and modifications are controlled by a series of masks. Because of the sheer number of devices on a typical wafer, the design of the masks are very complex.

Thus, the design of semiconductor devices and the masks used to make the devices is typically highly automated using sophisticated computer aided design (CAD) databases and procedures. Typical CAD databases store the VLSI design as a collection of shapes that are fabricated by a series of photolithography masks, with each mask part of a design level. A typical VLSI CAD database can include 20 or more design levels.

One of the more critical elements of a VLSI design is the size the device gates. Typically the size of the device gates will be controlled by a few of the multitude of design levels. For example, one design process simplifies and facilitates complex VLSI design by the automatic generation of the gate structures for both n-channel and p-channel devices from a generic gate design level. The generic gate design level is commonly referred to as the "GC" level for gate conductor commonly used in the gate structure gates and the mask used to created these shapes is referred to as the GC mask. A second design level, a diffusion level, defines the shape of a plurality of diffusion regions. The diffusion level is commonly referred to as the "AA" level, for "active area" and the masks used to create the diffusion level are referred to as AA masks. Some diffusion shapes will become n-type regions and others will become p-type. type GC and AA designs levels, taken together define the actual gate dimensions, while many other design levels are used to complete the design.

For example, another design level, typically a "positive-block" and/or "negative block" implant level determines which shapes in the AA level will be doped n-type and p-type respectively, and will be therefore be used to form various drain, source and channel regions.

The automatic generation of the device gates is accomplished by dividing the generic GC design level into three design levels based on their geometric interaction with other design levels. More specifically, the VLSI CAD system defines the gates of the field effect transistors (FETs) by the intersection of the shapes defining the GC level shapes with the shapes defining the AA level. The gate structures can then be further sorted as belonging to either n-channel or p-channel devices by examining their spatial relationship to the shapes in the positive block or negative block implant levels.

This system greatly facilitates the generation of complex VLSI devices, which can easily contain millions of devices. In particular, the use of a generic GC design level that is divided into areas for n-channel and p-channel devices, reduces the probability of human design error. Unfortunately, while the system greatly simplifies the design, the same system makes it difficult to individually compensate devices without degrading the resulting design. Device compensation is where the relative size (i.e., the gate width to length ratio) of some devices is changed, while other devices are left unchanged or changed in a different way.

There are several reasons why device compensation might be required. For example, the speed of complementary metal oxide semiconductor (CMOS) field effect transistors (FETs) is critically dependant on the width to length ratio of a gate on a given device. In many cases, VLSI circuit design requires individual compensation of n-channel and p-channel performance to achieve proper timing between devices. This requires the ability to selectively compensate the width to length ration of n-channel and p-channel devices. For example, the timing of logic circuitry critically depends on accurate speed control on n-channel as well as p-channel devices, and this may require shortening the length of a n-channel devices by one amount and shortening the length of all p-channel devices by another amount.

Thus, as CMOS processes mature the ability to selectively adjust the physical gate length of n-channel and p-channel devices to compensate for process and device-physics induced speed differences is needed. In the prior art, these adjustments are typically accomplished by compensating the width of lines that define the n-channel and p-channel gate structures. As stated previously, the gate dimensions are substantially determined by the GC and AA design levels, and thus those levels must be modified to selectively compensate the n-channel and p-channel gate structures.

The operation of a prior art method for device compensation will be described with reference to FIGS. 8–10. FIGS. 8–10 illustrate two design levels of a sample VLSI design 1000. Of course, in reality, a VLSI chip would contain millions of devices and would be far more complex than illustrated. FIGS. 8–10 illustrate only the gate-conductor (GC) design level and the active area diffusion (AA) design level, where actual VLSI chips would include many more additional design levels.

In the VLSI design 1000, the GC level comprises four shapes, 1002, 1004, 1006 and 1008. Likewise, the AA level comprises two shapes 1010 and 1012. In fabrication, the GC design level will be used to form the gates of the VLSI device while the AA level will be used to form the VLSI device diffusion regions. Thus, the GC shapes 1002, 1004, 1006 and 1008 each represent a conductor gate structure and the AA shapes 1010 and 1012 represent diffusion regions.

A further design level not illustrated in FIG. 8, called an implant level, determines which AA shapes are p-type and which are n-type diffusion regions. The implant level could be either a positive or negative implant block, meaning they respectively define regions that are masked off when a positive or negative implant is done. In the example of FIG. 8, assume that either a positive implant block covers AA shape 1010 and/or a negative implant block covers AA shape 1012 during a positive and/or negative implant respectively.

This will result in AA shape 1010 being a n-type diffusion region and AA shape 1012 being a p-type diffusion region.

In the design 1000, each overlap of the GC level shape with a AA level shape forms a field effect transistor. Thus, design 1000 forms six n-channel devices (GC shapes 1002 and 1004 intersecting with AA shape 1010 twice each, and GC shapes 1006 and 1008 intersecting once with AA shape 1010) and two p-channel devices (GC shapes 1006 and 1008 intersecting with AA shape 1012).

Current auto generation routines use basic Boolean operations, found in most CAD routines to first define the intersection of GC and an expansion of the AA shapes. Turning to FIG. 9, the GC shapes are intersected with the AA shapes with the resulting shapes comprising the gate regions of the devices. These shapes are then expanded in the gate width direction, resulting in the plurality of gate shapes 1020. The expansion of the gate shapes 1020 is important to ensure adequate overlap of the gate structure past the actual active area. The overlap is necessary to accommodate overlay errors, process induced pattern infidelities (corner rounding, line end shortening, etc.), and diffusion effects.

After the gate shapes arc expanded, they are sorted into gates for n-channel and p-channel devices. The gate shapes are then intersected with the appropriate positive block/ negative block implant shapes, with the gate shapes subtracted from the original GC design. This results in shapes stored in three separate design levels for individual size compensation. In particular, the gate shapes 1020 for n-channel devices are part of a n-gate level, the gates shapes 1020 for p-channel devices are part of the p-gate level, and the remaining CG shapes remain as a residual GC level.

With the GC level divided into n-gate, p-gate and residual GC levels, the individual devices can be compensated. This is done by taking the n-gate shapes 1020 and p-gate shapes 1020 and biasing (i.e., narrowing) them appropriately depending upon the amount of device compensation desired. In particular, the n-gate shapes 1020 can be narrowed to shorten the gate length of the n-channel devices and/or the p-gate shapes 1020 can be narrowed to shorten the gate length of the p-channel devices.

With the n-gate, p-gate and residual GC levels compensated, the three design levels are added back together. Turning now to FIG. 10, this results in compensated GC shapes. In particular, the width of the GC lines that correspond to the gate length of n-channel devices have been reduced by a predetermined amount and the width of the GC lines that correspond to the gate length of the p-channel devices have been reduced by a predetermined amount.

Thus, the prior art allows the gate lengths of the n-channel and p-channel devices to be selectively adjusted in the context of an auto generation routine. This method significantly streamlines the chip design process and helps to eliminate design errors. Unfortunatly, two substantial problems exist. In particular, this method of compensating gate lengths by adjusting n-gate and p-gate levels and adding those levels back to the residual GC level results in GC shapes that have a large number of jogs, such as jogs 1022. The presence of these jogs has several disadvantages. First, the jogs significantly increase the CAD data volume. Second, the presence of the jogs makes defect inspection more difficult, both on the mask and the final wafers, as it is more difficult to differentiate between these jogs and some types of defects. Finally, the large number of jogs combined with their close proximity to the active gate area causes imaging problems. In particular, significant comer rounding can occur at the resolution limits of the lithography tool and can cause the image pattern to change width over a long distance. This results in gate structures that exhibit continuous, wave like line width variation from the minimum width of the n-channel gates and p-channel gates to the maximum width of the poly conductor. This behavior can be extremely detrimental to device performance.

Some of these problems could in theory be corrected by increasing the GC to AA overlap, i.e, the amount that the active gates extend past the border of the diffusion region. In reality, however, one is limited in prior art methods by the fact that false intersections can resulting from overextending the AA shapes into such that they intersect with the GC shapes in undesirable ways. The maximum amount that a gate could be extended past the border of the diffusion region is therefor governed by the closest allowable approach of any gate conductor and diffusion shape without the intent to form a transistor. In high density VLSI devices, this amount is very small and is thus insufficient to allow sufficient compensation without excessive jogs.

Thus, there currently exists no method or system for auto generation of compensated gate shapes that does not result in the excessive jogs in the resulting design. Therefore, what is needed is an improved method for device compensation that works in the context of a CAD database and results in device shapes having minimum jogs.

DISCLOSURE OF INVENTION

According to the present invention, a method is provided to automatically generate compensated semiconductor devices based on existing VLSI CAD database circuit designs. The preferred method forms a plurality of edge projection shapes which are intersected with active area shapes to form gate edge shapes. The gate edge shapes and residual of the edge shapes are then sorted according to their relative position. These shapes are then selectively biased according to their relative position, and then are used to compensate the existing gate conductor shapes. Thus, this method provides a way to generate gate structures with compensated gate lengths for n-channel and p-channel devices based on existing gate, diffusion and implant designs. This system has the advantage of generating designs with detailed attention to the placement and minimization of jogs that negatively impact the lithography performance.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred system and method provides a mechanism to automatically derive designs for compensated semiconductor devices based on existing VLSI CAD database circuit designs. The system and method provides a way to generate gate structures with compensated gate lengths for n-channel and p-channel devices based on existing gate, diffusion and implant designs. More specifically, a system and method are provided to generate these designs with detailed attention to the placement and minimization of jogs that negatively impact the lithography performance.

Figure 1:
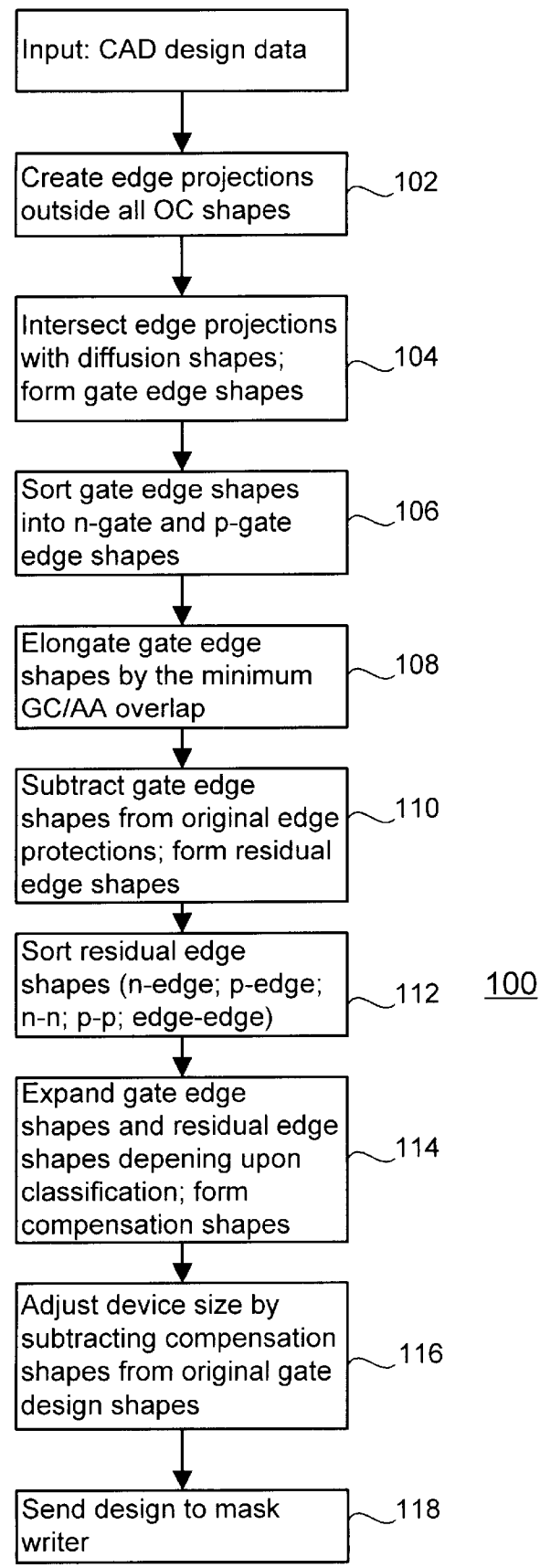
FIG. 1 is a flow diagram of a preferred method 100.

Referring now to the drawings, and more particularly to FIG. 1, a flow diagram illustrating a method 100 for compensating semiconductor gate length in the context of a VLSI CAD system is illustrated. The operation of method 100 will be discussed with reference to an example illustrated in FIGS. 2–7.

The method 100 inputs a VLSI CAD database. The CAD database preferably includes all the design levels that make up the device. A typical CAD database can include 20 or more design levels. Of these designs levels, a few control the gate dimensions of the various devices. In particular, the gate design level, commonly referred to as the "GC" level for the gate conductor used to define the gate structures for both n-channel and p-channel devices. Likewise, a diffusion level of the VLSI design system defines a plurality of n-type and p-type diffusions. The diffusion level is commonly referred to as the "AA" level, for "active area." These two design levels intersected together define the gate dimensions, while many other design levels are used to complete the design.

Figure 8:
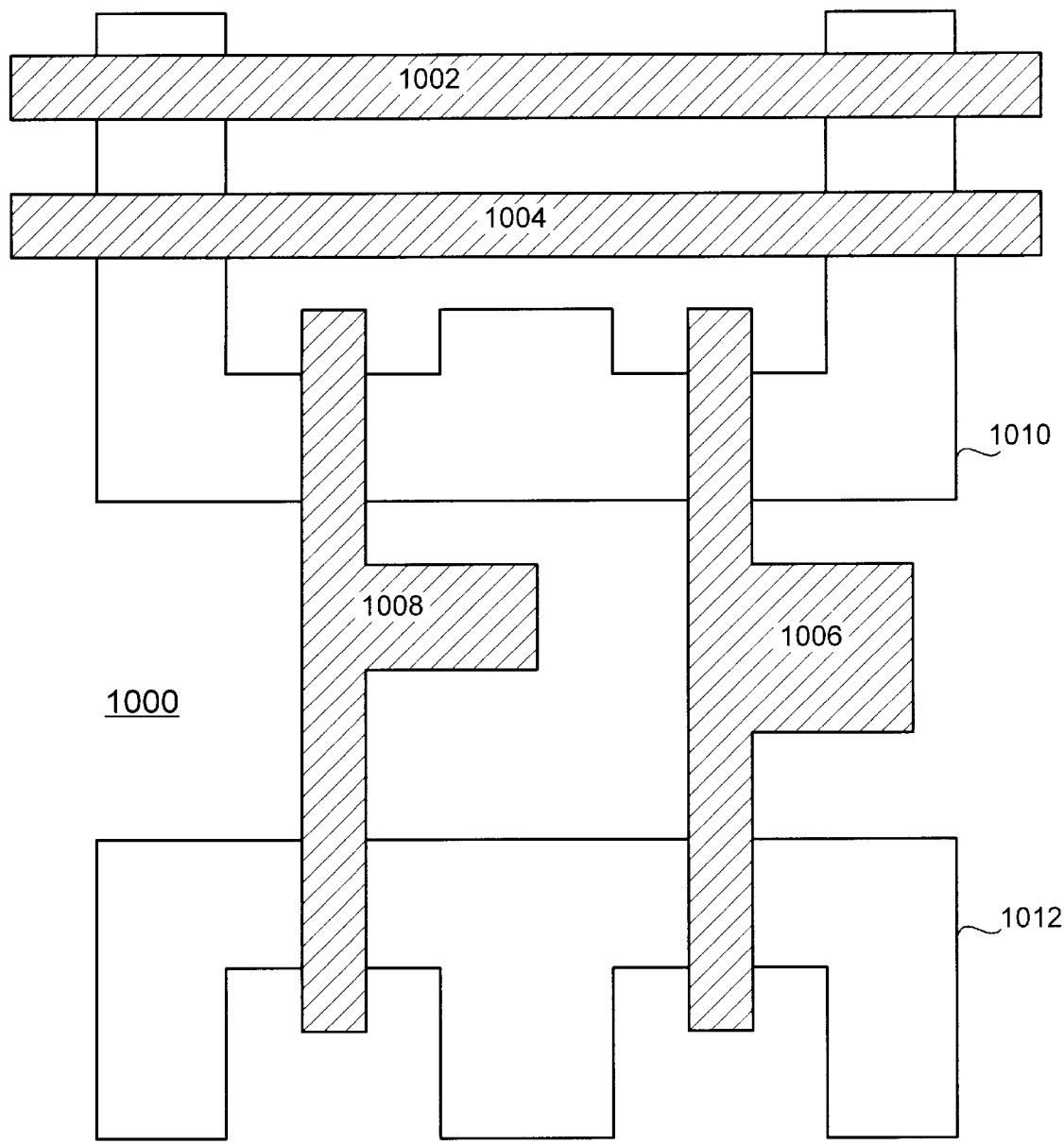
FIG. 8 is a schematic view of an active area design level and a gate conductor design level.
Figure 9:
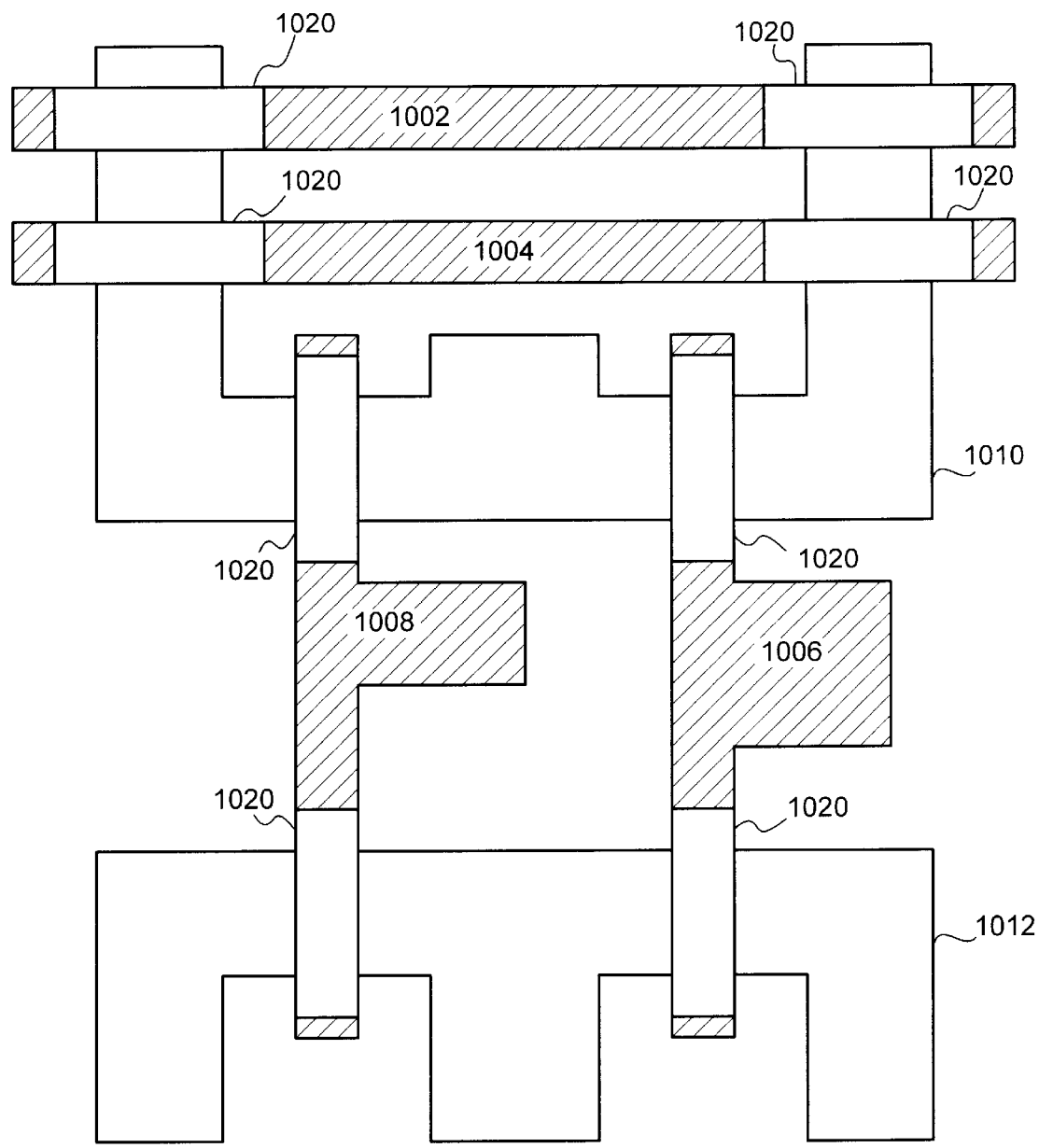
FIG. 9 is a schematic view of an active area design level and a gate conductor design level and a plurality of gate shapes.
Figure 10:
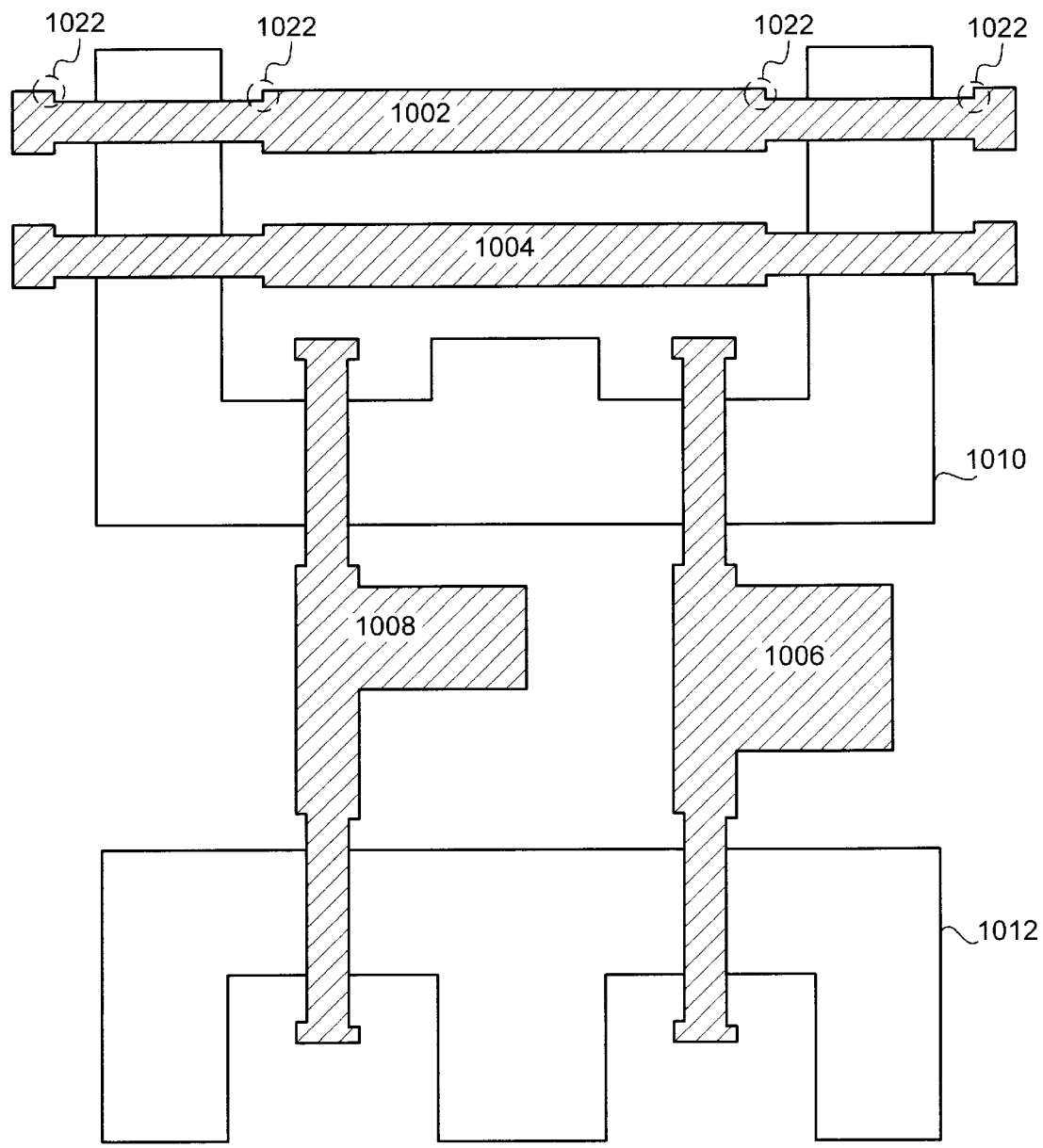
FIG. 10 is a schematic view of an active area design level and a gate conductor design level with prior art compensated gate lengths.

Turning briefly to FIG. 8, the GC and AA design levels of a sample VLSI design 1000 are illustrated. These design levels are the same as prior art designs with no modifications, and thus the preferred method 100 can be used with existing VLSI CAD databases.

Again, in the VLSI design 1000, the GC level comprises four shapes, 1002, 1004, 1006 and 1008. Likewise, the AA level comprises two shapes 1010 and 1012. In fabrication, the GC design level will be used to form the gates of the VLSI device while the AA level will be used to form the VLSI device diffusion regions. Thus, the GC shapes 1002, 1004, 1006 and 1008 each represent a conductor gate structure and the AA shapes 1010 and 1012 represent diffusion regions.

A further design level not illustrated in FIG. 8, called an implant level, determines which AA shapes are p-type and which are n-type diffusion regions. The implant level could be either a positive or negative implant block, meaning they respectively define regions that are masked off when a positive or negative implant is done. In the example of FIG. 8, assume that either a positive implant block covers AA shape 1010 and/or a negative implant block covers AA shape 1012 during a positive and/or negative implant respectively. This will result in AA shape 1010 being a n-type diffusion region and AA shape 1012 being a p-type diffusion region.

In the design 1000, each overlap of the GC level shape with a AA level shapes forms a field effect transistors. Thus, design 1000 forms six n-channel devices (GC shapes 1002, 1004, 1006 and 1008 intersecting with AA shape 1010) and two p-channel devices (GC shapes 1006 and 1008 intersecting with AA shape 1012).

Figure 2:
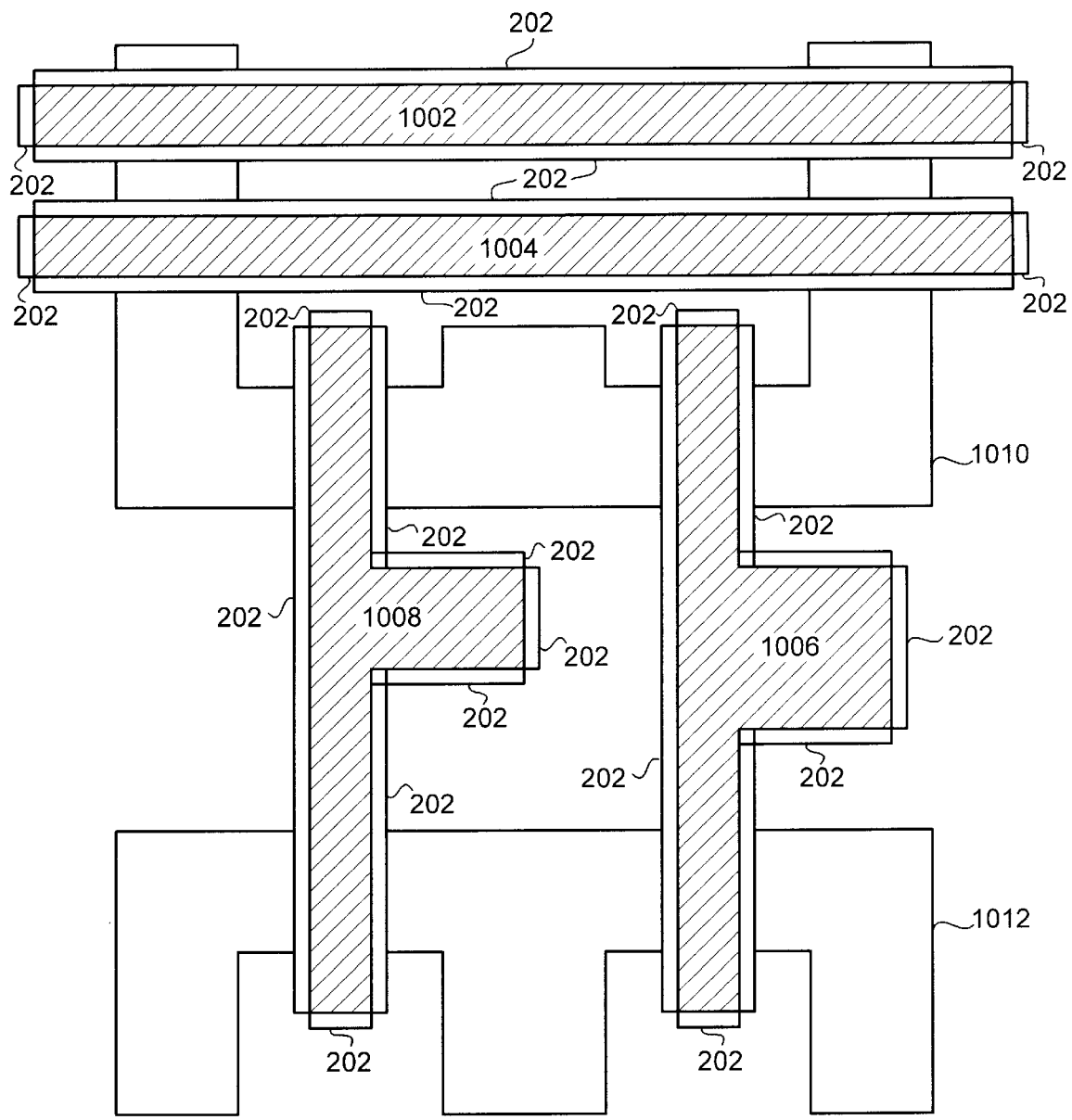
FIG. 2 is a schematic view of an active area design level and a gate conductor design level with a plurality of edge projections.

Turning back to FIG. 1, the first step 102 in the method 100 is to create edge projections outside all GC level shapes. The edge projections are preferably formed by forming a rectangle on every edge of the GC shapes. In particular, each edge is defined by two points, and that edge is extended out, forming a rectangle. This is done for every edge of GC shapes 1002, 1004, 1006 and 1008. The edge projections 202 are illustrated in FIG. 2.

Figure 3:
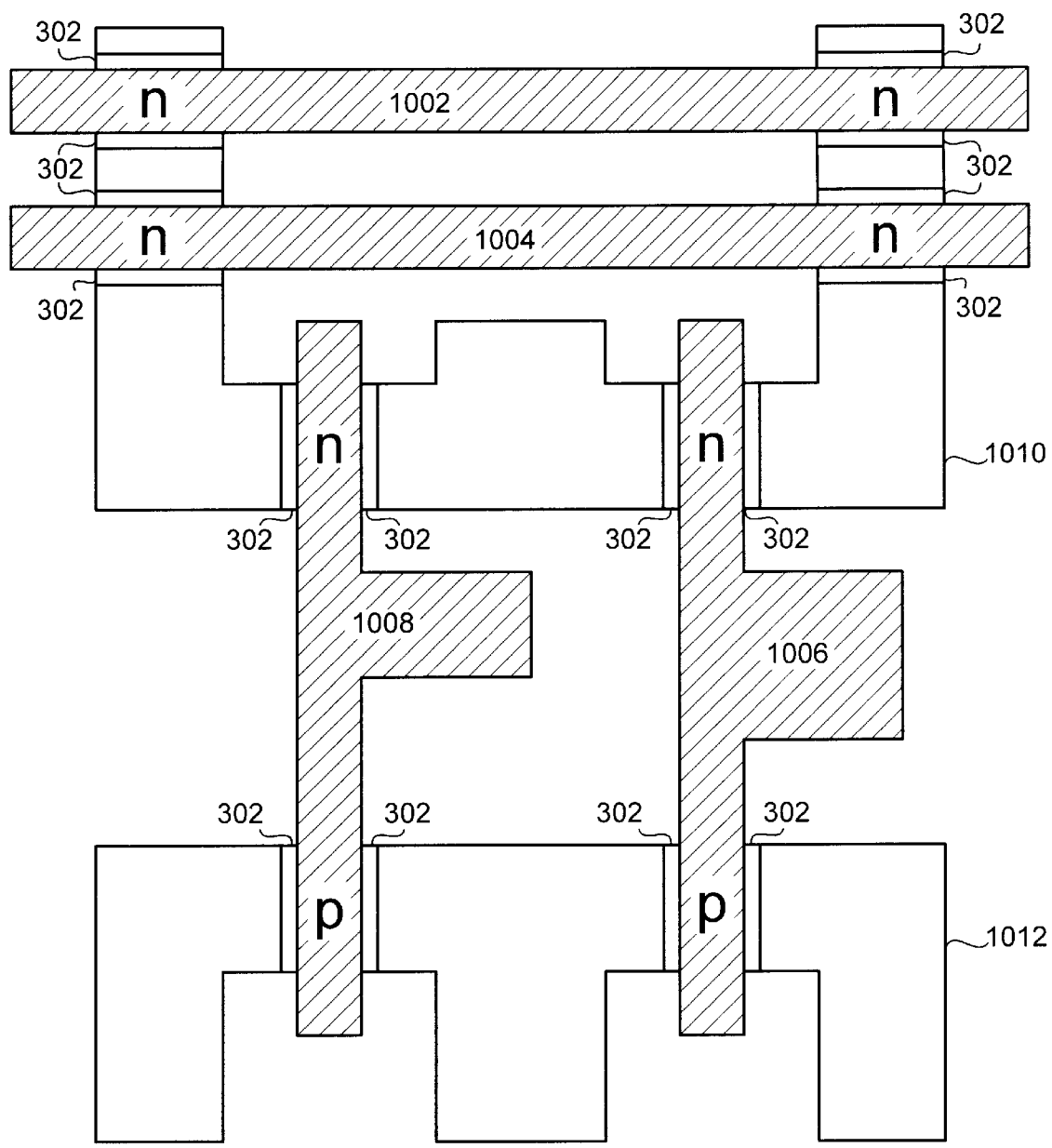
FIG. 3 is a schematic view of an active area design level and a gate conductor design level with a plurality of gate edge shapes.

The next step 104 is to intersect the edge projections with the underlying diffusion shapes. This forms a plurality of shapes called "gate edge shapes" that locate the edges of all the active gates. Turning to FIG. 3, the plurality of edge shapes 202 are intersected with the AA shapes 1010 and 1012, forming a plurality of gate edge shapes 302. The gate edge shapes thus follow the transistor gate along its entire width.

The next step 106 is to sort the gate edge shapes into edge shapes that correspond to p-channel and n-channel devices (referred to herein as p-gate and n-gate edge shapes respectively). This sorting is done by comparing the relative location of the gate edge shapes 302 to the various diffusion regions. In the illustrated example, AA shape 1010 is a n-type diffusion shape and hence the gate edge shapes 302 that intersect it are n-gate edge shapes. Conversely, the AA shape 1012 is a p-type diffusion shape and the gate edge shapes 302 that intersect it are p-gate edge shapes. This sorting is illustrated in FIG. 3 by the "P" or "N" adjacent the relative various edge gate shapes.

Figure 4:
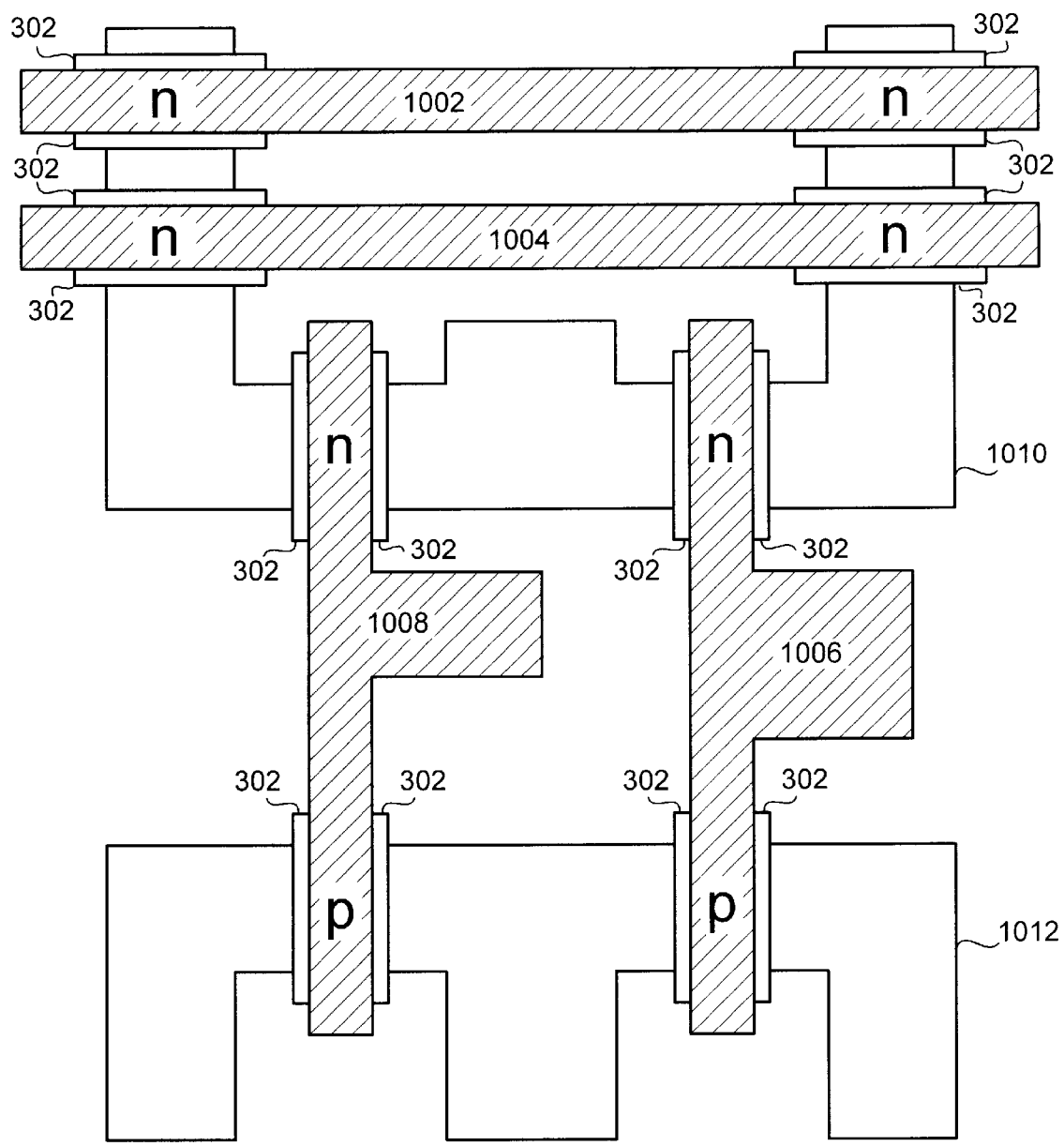
FIG. 4 is a schematic view of an active area design level and a gate conductor design level with a plurality of expanded gate edge shapes.

The next step 108 is to elongate the gate edge shapes by the minimum GC to AA overlap. This is done to ensure that all process tolerances can be contained in the worst case design. In particular, the elongation is important to ensure adequate overlap of the gate structure past the actual active area in the event of alignment error. The overlap is necessary to accommodate overlay errors, process induced pattern infidelities (corner rounding, line end shortening, etc.), and diffusion effects. The elongated gate edge shapes 302 are illustrated in FIG. 4.

Figure 5:
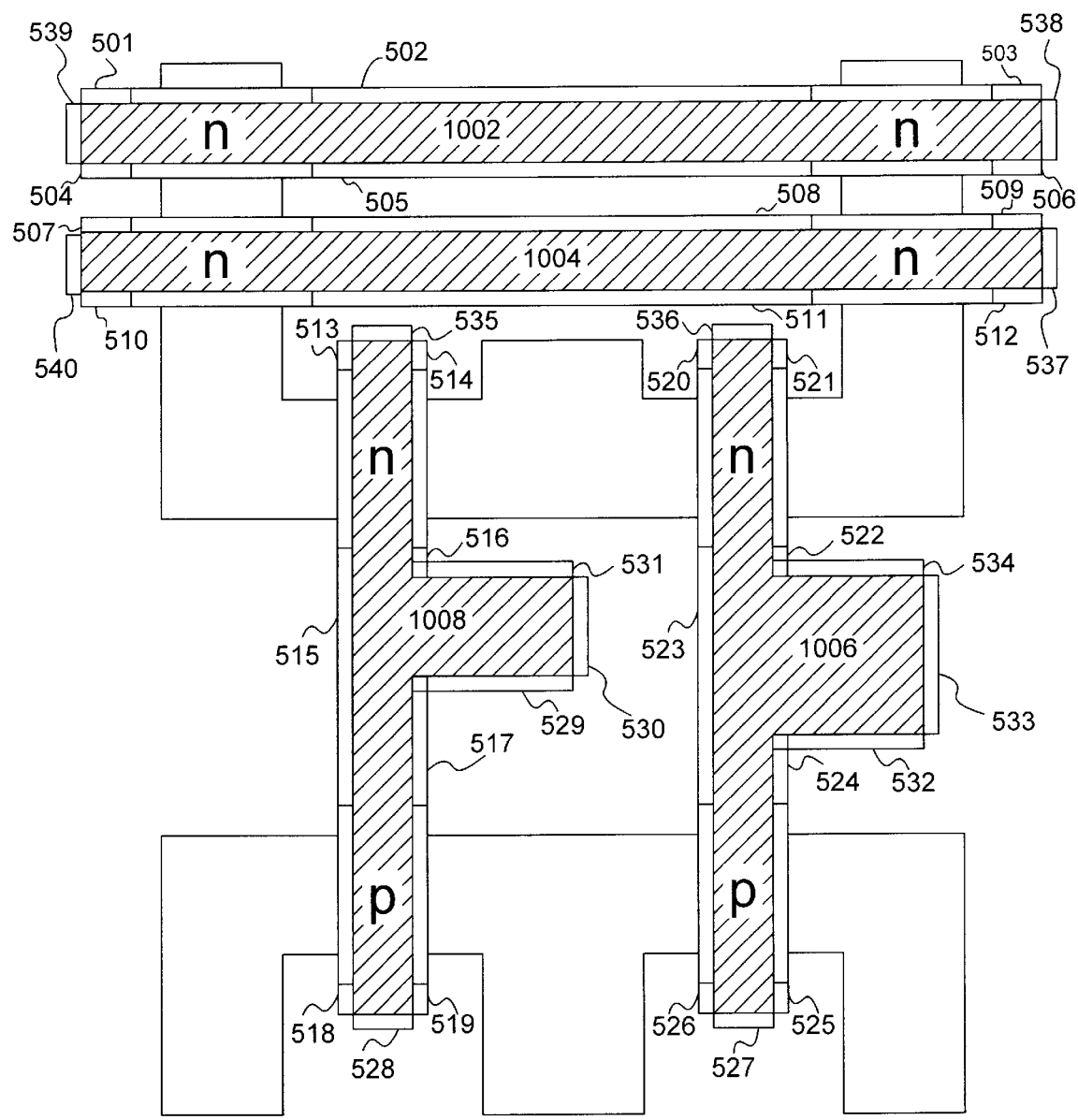
FIG. 5 is a schematic view of an active area design level and a gate conductor design level with a plurality of expanded gate edge shapes and a plurality of residual edge shapes.

The next step 110 is to subtract the elongated gate edge shapes from the original edge projection shapes, forming residual edge shapes. In FIG. 5, the subtraction of the edge projection shapes 202 (of FIG. 2) from the elongated gate edge shapes forms a plurality of residual edge shapes 501–540, which are illustrated along with the gate edge shapes 302. Thus, these residual edge shapes 501–540 are formed using a simple difference operation.

The next step 112 is to sort the residual edge shapes according to what type of edge gate shapes and/or GC shape edges they extend between. In particular, the residual edge shapes are sorted into six groups; i.e., shapes that extend from an n-gate edge shape to an GC shape edge (n-edge), shapes that extend from a p-gate edge shape to an GC shape edge (p-edge), shapes that extend from an n-gate edge shape to another n-gate edge shape (n-n), shapes that extend from a p-gate edge shape to another p-gate edge shape (p-p), shapes that extend from an n-gate edge shape to a p-gate edge shape (n-p) and shapes that do not touch any gate edge shapes (edge-edge).

Referring back to FIG. 5, residual edge shapes 501, 503, 504, 506, 507, 509, 510, 512, 513, 516, 521 and 522 all extend from a n-gate edge shape to a GC shape edge. It will be noted that shapes 522 and 516 extend into a inner GC shape corner while the others will the others terminate at an outside corner. According to the preferred embodiment this does not make a difference, and all the above shapes are sorted into one group as extending from a n-gate edge shape to a GC shape edge. Likewise, residual edge shapes 517, 518, 519, 524, 525 and 526 each extend from a p-gate edge shape to an GC shape edge. The residual shapes 502, 505, 508 and 511 extend from an n-gate edge shape to another n-gate edge shape. The residual shapes 515 and 523 extend from a n-gate edge shape to a p-gate edge shape. There are no residual shapes that extend from a p-gate edge shape to another p-gate edge shape in the example of FIG. 5.

Finally, the residual edge shapes 527, 528, 529, 530, 531, 532, 533, 534, 535, 536, 537, 538, 539 and 540 all do not touch any gate edge shapes, and are thus sorted into the last group. These shapes are not needed for the preferred method 100 and thus can be deleted from the database at this time.

With the residual edge shapes sorted, the next step 114 is to bias the edge gate shapes and the residual gate shapes according to their various classifications. This biasing is preferably an expansion of the gate edge and residual shapes in both directions, such that the various gate edge shapes and residual shapes overlap the GC shapes a predetermined amount. As will become clear later, the amount of expansion is determined by the amount of gate length compensation that is desirable for the various devices.

In the preferred embodiment, the n-gate edge shapes, the n-edge residual shapes and the n-n residual shapes are all expanded the same predetermined amount. Likewise, the p-gate edge shapes, the p-edge residual shapes and the p-p residual shapes are all expanded the same predetermined amount. The remaining shapes, the n-p residual shapes, can be treated in several different ways, with each way having advantages.

One method expands the n-side of the n-p residual shape the same amount as the other n-shapes, while expanding the p-side of the n-p residual shape in the same amount as the other p-shapes, with one jog in the middle of the n-p residual shape where the two sides meet. This method has the advantage of replacing the multitude of jogs with one jog in the middle of the GC shape.

A second method either narrows the n-p residual shape or expands the n-p residual shape a relatively small amount. This results in two jogs, one at the n-p residual shape/n-gate edge shape junction and the other at the n-p residual shape/p-gate edge shape junction. This method has the advantage of improving the ability to visual inspect the device where the expansion amount for both the n-channel and p-channel gates is very small, although it does create more jogs than the first method.

If however, the amount of gate length compensation is the same for both n-channel device gates and p-channel devices gates, all jogs can be eliminated by expanding the n-p residual shapes by the common expansion factor.

Figure 6:
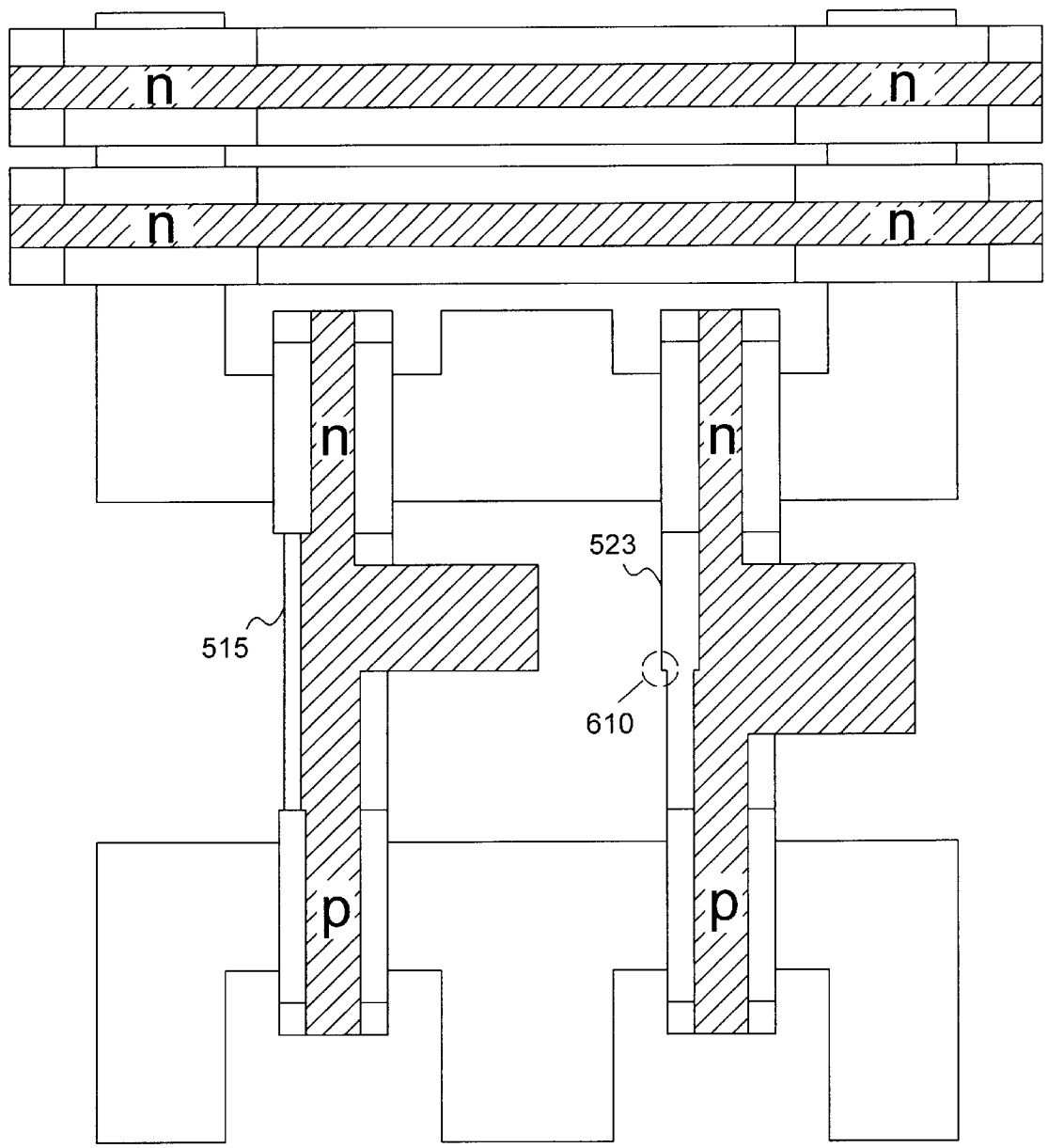
FIG. 6 is a schematic view of an active area design level and a gate conductor design level with a plurality of expanded gate edge shapes and a plurality of residual edge shapes biased for device compensation.

Turning to FIG. 6, the edge gate shapes and residual shapes are expanded according to the preferred embodiment. The n-gate edge shapes 302, the n-edge residual shapes 501, 503, 504, 506, 507, 509, 510, 512, 513, 516, 521 and 522, and the n-n residual shapes 502, 505, 508 and 511 are all expanded in both directions a predetermined distance. This causes these shapes to overlap the corresponding GC shapes a set amount.

Likewise, the p-gate edge shapes 302, the p-edge residual shapes 517, 518, 519, 524, 525, and 526, are all expanded in both directions a predetermined distance (there are no p-p edge residual shapes in the illustrated example, but if there were they would also be expanded the same amount). Again this causes these shapes to overlap the corresponding GC shapes a set amount.

The n-p residual shape 523 has been expanded according to the first method, and the n-p residual shape 513 has been expanded according to the second method. In particular, the n-side of the n-p residual shape 523 has been expanded the same amount as the other n-shapes, while the p-side of the n-p residual shape 523 has been expanded in the same amount as the other p-shapes. This method creates one jog 610 in the middle of the n-p residual shape where the two sides meet. Conversely, the n-p residual shape 513 has been operated on with the second method and narrowed (or expanded less) than both the n-shapes and p-shapes.

The next step 116 is to adjust the semiconductor device sizes. This is done by subtracting the expanded gate edge and residual shapes from the GC shapes, resulting in narrower GC shapes, which will result in shorter gate lengths for the various devices.

In the case where the n-p residual shape has been narrowed it will not overlap and the subtraction of step 116 actually results in the GC shape being widened at those areas.

Figure 7:
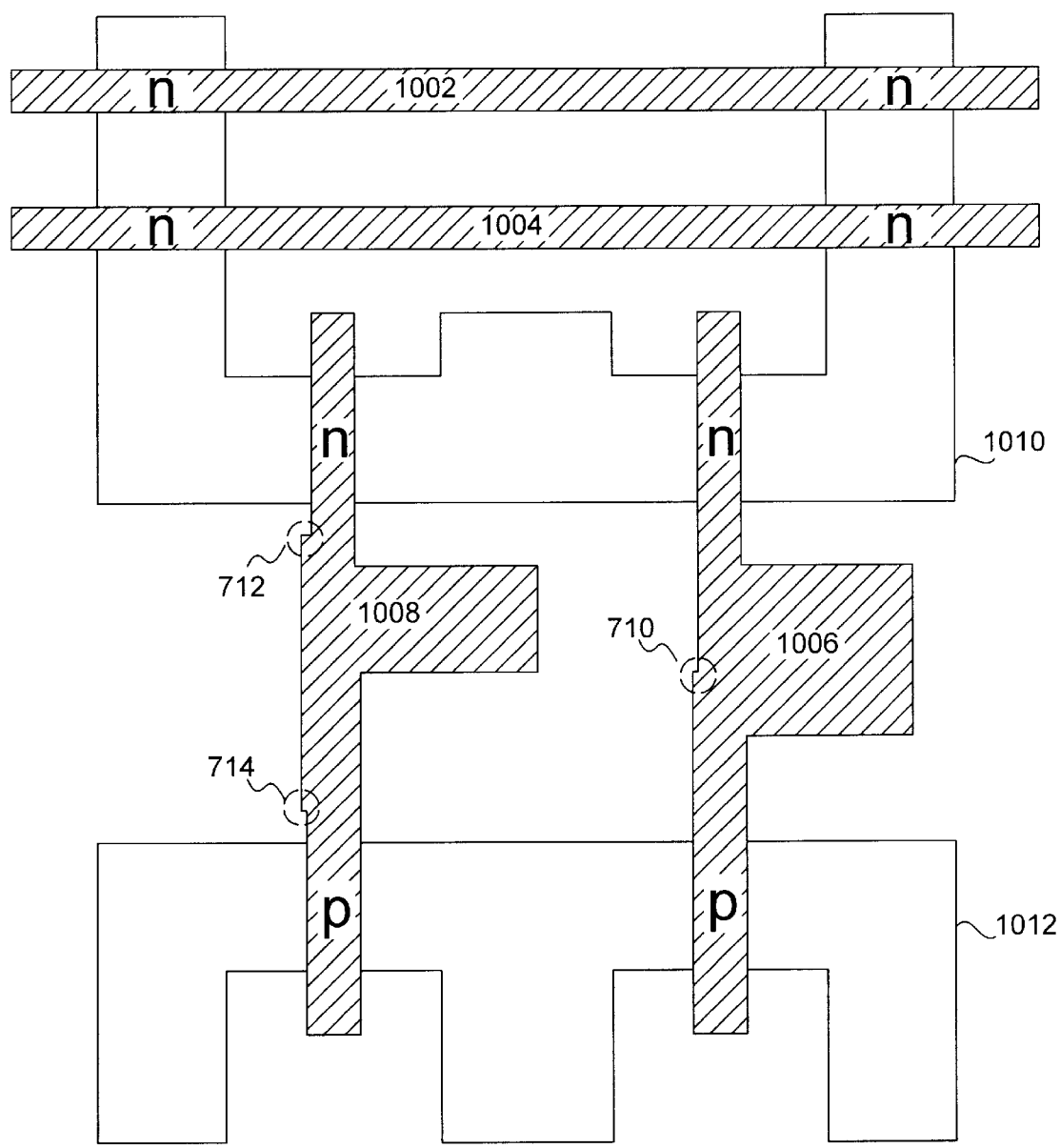
FIG. 7 is a schematic view of an active area design level and a gate conductor design level with a compensated gate lengths in accordance with the preferred embodiment.

Turning to FIG. 7, subtracting the expanded edge shapes from the original GC shapes results in modified GC shapes that will result in shorter gate lengths while minimizing the number of jogs in the final design. In particular, the GC shapes that are used to create only gates for only one type of device, either n or p channel, such as GC shape 1002 and 1004, which both are only for n-channel device gates, have been narrowed without creating any jogs that could result in fabrication problems.

The n-channel gate side and p-channel gate side of GC shape 1006 have both been narrowed with only one jog 710 in the middle. The elimination of the other jogs minimizes the risk of fabrication error and makes visual defect inspection much easier. This method of is preferable where the jog is large enough to rendered by both the defect inspection tool (typically an optical tool) and a computer rendering (which also typically have a limited resolution) of the design. This assures that the jog will not be confused as a defect. Additionally, this method is preferable where the jog is small enough such that it will not be rendered by the defect inspection tool or the computer rendering. In this case, the jog will not be found nor expected, and thus will not be confused as a defect.

The n-channel gate side and p-channel gate side of GC shape 1008 have also both been narrowed, but the other areas have been widened (or narrowed less) and this method creates two jogs 712 and 714 in the GC shape. This has the advantage of expanding the size of both jogs such that they can both be rendered by the defect inspection tool and the computer rendering. Thus, this method is preferable where the size of a single jog (created by the first method) would have been greater than the inspection tool resolution and less than the computer rendering tool resolution or vic versa.

The last step 118 is to create the masks for the resulting design. This typically is done by sending the CAD data to a specialized mask writer. The masks can then be used to create VLSI devices will appropriately biased gate lengths for n-channel and p-channel devices.

Thus, the preferred method 100 is able to compensate the gate lengths of semiconductor devices in a method that results in minimum jogs in the resulting shapes. The method 100 can be used with existing VLSI CAD databases and thus can be used on previous designs without requiring extensive reworking. The preferred embodiment thus provides a system method that can automatically adjust the width of n-gate and p-gate shapes while optimizing the topology of the resulting designs.

While the invention has been particularly shown and described with reference to a preferred exemplary embodiment thereof, it will be understood by those skilled in the art that various changes in form and details may be made therein without departing from the spirit and scope of the invention.

It is important to note that while the present invention has been described in the context of a fully functional computer system, those skilled in the art will appreciate that the mechanisms of the present invention are capable of being distributed as a program product in a variety of forms, and that the present invention applies equally regardless of the particular type of signal bearing media to actually carry out the distribution. Examples of signal bearing media include: recordable type media such as floppy disks, hard disks and CD ROMS, and transmission type media such as digital and analog communication links, including wireless communication links.

We claim:

1. A program product comprising:
   (A) a compensation mechanism for compensating the length of devices in a VLSI circuit design that minimizes the number of jogs in the resulting gate conductor design, the compensation mechanism including mechanisms for:
      a) forming a plurality of edge projections from a plurality of gate conductor shapes;
      b) intersecting said plurality of edge projections with a plurality of active area shapes, said intersection forming a plurality of gate edge shapes;
      c) subtracting said plurality of gate edge shapes from said plurality of edge projections, said subtraction forming a plurality of residual edge shapes;
      d) sorting said plurality of residual edge shapes into n-edge, p-edge, n-n, p-p, n-p and edge-edge shapes;
      e) biasing said plurality of gate edge shapes and said residual edge shapes; and
      f) wherein said plurality of gate edge shapes and said residual edge shapes combine with said gate conductor shapes to result in a compensated device length; and
   (B) computer-readable signal bearing media bearing the compensation mechanism.

2. The program product of claim 1 wherein the signal bearing media comprises recordable media.

3. The program product of claim 1 wherein the signal bearing media comprises transmission media.

4. The program product of claim 1 wherein the compensation mechanism includes mechanisms for:
   sorting said plurality of gate edge shapes into p-channel and n-channel gate edge shapes; and
   elongating said plurality of gate edge shapes.

5. The program product of claim 1 wherein the compensation mechanism includes mechanisms for:
   biasing said p-gate edge shapes, said p-edge residual shapes and said p-p residual shapes a first predetermined amount;
   biasing said n-gate edge shapes, said n-edge residual shapes and said n-n residual shapes a second predetermined amount; and
   biasing said n-p residual shapes.

6. The program product of claim 1 wherein the compensation mechanism biases said n-p residual shapes by biasing said n-p a third predetermined amount.

7. The program product of claim 1 wherein the compensation mechanism biases said n-p residual shapes by biasing the p-side of said n-p residual shape said first predetermined amount and biasing the n-side of said n-p residual shapes said second predetermined amount.

8. The program product of claim 1 wherein the compensation mechanism further includes mechanisms for subtracting said edge shapes and said residual shapes from said gate conductor shapes.

9. A program product comprising:
   (A) a compensation mechanism for compensating the length of devices in a VLSI circuit design, the compensation mechanism including mechanisms for:
      a) forming a plurality of edge projections from a plurality of gate conductor shapes;
      b) intersecting said plurality of edge projections with a plurality of active area shapes, said intersection forming a plurality of gate edge shapes;
      c) sorting said plurality of gate edge shapes into p-channel and n-channel gate edge shapes;
      d) elongating said plurality of gate edge shapes;
      e) subtracting said elongated plurality of gate edge shapes from said plurality of edge projections, said subtraction forming a plurality of residual edge shapes;
      f) sorting said plurality of residual edge shapes into n-edge, p-edge, n-n, p-p, n-p and edge-edge shapes;
      g) biasing said p-gate edge shapes, said p-edge residual shapes and said p-p residual shapes a first predetermined amount;
      h) biasing said n-gate edge shapes, said n-edge residual shapes and said n-n residual shapes a second predetermined amount;
      i) biasing said n-p residual shapes; and
      j) subtracting said edge shapes and said residual shapes from said gate conductor shapes; and
   (B) computer-readable signal bearing media bearing the compensation mechanism.

10. The program product of claim 9 wherein the signal bearing media comprises recordable media.

11. The program product of claim 9 wherein the signal bearing media comprises transmission media.

12. The program product of claim 9 wherein the compensation mechanism biases said n-p residual shapes by biasing said n-p a third predetermined amount.

13. The program product of claim 9 wherein the compensation mechanism biases the p-side of said n-p residual shape said first predetermined amount and biases the n-side of said n-p residual shapes said second predetermined amount.

14. A program product comprising:
   (A) a compensation mechanism for compensating the gate length of devices in a VLSI circuit design that minimizes the number of jogs in the resulting gate conductor design, the compensation mechanism comprising:

a) a VLSI database, said VLSI database containing the design levels of said VLSI circuit design, including an active area design level comprising a plurality of active area shapes and a gate conductor level comprising a plurality of gate conductor shapes;

b) a mechanism for forming a plurality of edge projections from said plurality of gate conductor shapes;

c) an intersection mechanism for intersecting said plurality of edge projections with a plurality of active area shapes, said intersection mechanism forming a plurality of gate edge shapes;

d) a subtraction mechanism for subtracting said plurality of gate edge shapes from said plurality of edge projections, said subtraction mechanism forming a plurality of residual edge shapes;

e) a sorting mechanism for sorting said plurality of residual edge shapes into n-edge, p-edge, n-n, p-p, n-p and edge-edge shapes;

f) a biasing mechanism for biasing said p-gate edge shapes, said p-edge residual shapes and said p-p residual shapes a first predetermined amount, biasing said n-gate edge shapes, said n-edge residual shapes and said n-n residual shapes a second predetermined amount, and biasing said n-p residual shapes; and g) a subtraction mechanism for subtracting said edge shapes and said residual shapes from said gate conductor shapes, wherein said plurality of gate edge shapes and residual edge shapes are combined with said gate conductor shapes to result in compensated device lengths; and (B) computer-readable signal bearing media bearing the compensation mechanism.

15. The program product of claim 14 wherein the signal bearing media comprises recordable media.

16. The program product of claim 14 wherein the signal bearing media comprises transmission media.

17. The program product of claim 14 wherein said biasing mechanism bias said n-p residual shapes a third predetermined amount.

18. The program product of claim 14 wherein said biasing mechanism biases the p-side of said n-p residual shape said first predetermined amount and biases the n-side of said n-p residual shapes said second predetermined amount.

* * * * *